United States Patent
Ye et al.

(10) Patent No.: US 11,895,471 B2
(45) Date of Patent: Feb. 6, 2024

(54) METHOD FOR OPERATING A DEVICE HAVING A SPEAKER SO AS TO PREVENT UNEXPECTED AUDIO OUTPUT

(71) Applicant: Orange, Paris (FR)

(72) Inventors: Nan Ye, Beijing (CN); Meng Suo, Beijing (CN)

(73) Assignee: Orange

(*) Notice: Subject to any disclaimer, the term of this patent is extended or adjusted under 35 U.S.C. 154(b) by 0 days.

(21) Appl. No.: 17/279,829

(22) PCT Filed: Sep. 23, 2019

(86) PCT No.: PCT/IB2019/001092
§ 371 (c)(1),
(2) Date: Mar. 25, 2021

(87) PCT Pub. No.: WO2020/065405
PCT Pub. Date: Apr. 2, 2020

(65) Prior Publication Data
US 2021/0400384 A1 Dec. 23, 2021

(30) Foreign Application Priority Data
Sep. 28, 2018 (WO) ............... PCT/CN2018/108185

(51) Int. Cl.
*H04R 3/04* (2006.01)
*G10L 21/0216* (2013.01)
(52) U.S. Cl.
CPC ............ *H04R 3/04* (2013.01); *G10L 21/0216* (2013.01); *G10L 2021/02163* (2013.01); *H04R 2430/01* (2013.01)

(58) Field of Classification Search
None
See application file for complete search history.

(56) References Cited

U.S. PATENT DOCUMENTS

| 7,869,768 B1 | 1/2011 | Vishlitzky |
| 2005/0282590 A1* | 12/2005 | Haparnas ............ H04M 1/6016 |
| | | 455/570 |
| 2008/0159561 A1* | 7/2008 | Parker ................. G06F 9/4418 |
| | | 381/94.5 |

(Continued)

FOREIGN PATENT DOCUMENTS

| CN | 101242595 A | 8/2008 |
| CN | 101740036 A | 6/2010 |
| CN | 104158939 A | 11/2014 |

OTHER PUBLICATIONS

English machine translation of WO2018223535A1 corresponding to US20200374381A1 (Year: 2017).*

(Continued)

*Primary Examiner* — James K Mooney
(74) *Attorney, Agent, or Firm* — Knobbe, Martens, Olson & Bear, LLP

(57) ABSTRACT

A method for operating an electronic device comprising a processing unit and a speaker is disclosed. The method comprises the following acts, performed by the processing unit: when detecting that a process implying audio output from the speaker is to be performed, determining (a) that the user is in a quiet environment; and performing (h) the process with a reduced level of audio output from the speaker.

17 Claims, 2 Drawing Sheets

(56) References Cited

U.S. PATENT DOCUMENTS

| | | | | |
|---|---|---|---|---|
| 2012/0291053 A1* | 11/2012 | Carter | ................... | G06F 3/165 |
| | | | | 719/328 |
| 2013/0018584 A1* | 1/2013 | You | ................... | H04M 1/72454 |
| | | | | 702/1 |
| 2013/0064380 A1* | 3/2013 | Mahowald | ............... | H03G 3/32 |
| | | | | 381/57 |
| 2014/0068434 A1* | 3/2014 | Filev | ................... | G06F 3/0484 |
| | | | | 715/716 |
| 2017/0126192 A1 | 5/2017 | Fu | | |
| 2018/0122372 A1* | 5/2018 | Wanderlust | ............. | G06F 3/167 |
| 2020/0374381 A1* | 11/2020 | Li | ........................ | H04M 1/724 |

OTHER PUBLICATIONS

International Search Report for International Application No. PCT/IB2019/001092 dated Jan. 28, 2020.

Notification of Transmittal of The International Search Report and The Written Opinion of The International Searching Authority or The Declaration for International Application No. PCT/CN2018/108185, dated May 28, 2019.

\* cited by examiner

METHOD FOR OPERATING A DEVICE HAVING A SPEAKER SO AS TO PREVENT UNEXPECTED AUDIO OUTPUT

CROSS-REFERENCE TO RELATED APPLICATIONS

This application is filed under 35 U.S.C. § 371 as the U.S. National Phase of Application No. PCT/IB2019/001092 entitled "METHOD FOR OPERATING A DEVICE HAVING A SPEAKER SO AS TO PREVENT UNEXPECTED AUDIO OUTPUT" and filed Sep. 23, 2019, and which claims priority to PCT/CN2018/108185 filed Sep. 28, 2018, each of which is incorporated by reference in its entirety.

BACKGROUND

Field

The field of this invention is that of mobile phones having speakers. More particularly, the invention relates to a method for operating a device so as to prevent unexpected audio outputs.

Description of the Related Technology

Recent mobile phones (smartphones) offer numerous features, including UPS, internet, music, video playing, games and countless apps.

Several mobile operating systems (OS) such as Android or iOS provide a management of audio outputs which depends on the application running in foreground.

More precisely, one or more applications could be launched simultaneously, in particular:
  one application running in "foreground" (i.e. the application "active" with which the user interacts in real time); and
  the possible other applications running in "background" (i.e. "behind the scenes", without user intervention and mostly without, if not at all, interaction).

If a first application running in foreground has audio output (like video/music player, games, etc.) and is switched by the user (i.e. the user starts a second application and the first application now runs in background) the audio output of the first application is suspended. If the user brings back the first application in foreground, the audio output is resumed.

Further, the operating systems are generally able to distinguish different audio output units such as built-in speaker, earphones, a Bluetooth headset, a wireless smart speaker, etc.: for different audio output units, the OS will adjust the volume to different levels.

These mechanisms generally allow a comfortable continuity of audio outputs with few interactions.

Nevertheless, users could be put in awkward positions by their audio outputs in some situation if they unlock their phone while an application with a loud audio input is still running in foreground (for instance a movie was being watched) or if they accidentally select this application while it was running in background.

In all of these cases, the audio output is automatically resumed on the built-in speaker of the phone, causing an embarrassing loud noise drawing attention to the user.

There is consequently a need for a simple and user-friendly solution which prevents the occurrence of such situations.

SUMMARY OF CERTAIN INVENTIVE ASPECTS

For these purposes, the present invention provides a method for operating an electronic device comprising a processing unit and a speaker, the method being characterized in that it comprises the following steps, performed by the processing unit:
  when detecting that a process regarding an application installed in the electronic device which implies audio output from the speaker is to be performed, determining that the electronic device is in a quiet environment;
  when the electronic device is determined to be in a quiet environment, performing said process with a reduced level of audio output from the speaker.

As it will be shown, such assessment of the environment allows to foreseeing whether noise from the speaker could be heard and embarrass the user, so as to enable reducing the level of audio output in such a case, and prevent the occurrence of any awkward situation, while still allowing a comfortable continuity of audio outputs with few interactions.

Preferred but non limiting features of the present invention are as follow:
  the process regarding an application installed in the electronic device corresponds to one of the following:
    the unlocking of the electronic device by a user while said application is running in the foreground and provides an audio output;
    the switching of said application from running in background to running in foreground while said application provides an audio output; and
    the disconnection of an external audio output unit while said application is running in foreground and provides an audio output.
  the electronic device comprises a microphone, the determining step comprises recording ambient noise using the microphone;
  the determining step further comprises analyzing the recorded ambient noise so as to determine a noise intensity value;
  the environment is considered quiet when said noise intensity value is below a predetermined threshold;
  said reduced level of audio input is function of the noise intensity value determined;
  the speaker is muted in the performing step.
  the method comprises a previous step of monitoring requests for audio output, from an application to the speaker, so as to detect when a process implying audio output from the speaker is to be performed;
  the method is implemented by a media controller of an operating system of the device;
  the determining step is only performed when detecting that a process implying audio output from the speaker is to be resumed;
  the performing step comprises, if it has been determined that the electronic device is not in a quiet environment, performing said process with a normal level of audio output from the speaker;
  the performing step comprises, if it has been determined that the electronic device is in a quiet environment, inviting the user to confirm whether to perform said process with a reduced level of audio output from the speaker;
  the inviting step comprises requesting the user to choose between:

performing said process with a reduced level of audio output from the speaker;

performing said process with a normal level of audio output from the speaker;

cancelling said process.

In a second aspect, the invention provides an electronic device comprising at least one processing unit and a speaker, said processing unit being configured to implement:

when detecting that a process implying audio output from the speaker is to be performed, determining that the electronic device is in a quiet environment;

when the electronic device is determined as being in a quiet environment, performing said process with a reduced level of audio output from the speaker.

According to a third and a fourth aspects, the invention provides a computer program product, comprising code instructions for executing a method according to the first aspect for operating a device comprising at least one processing unit and a speaker; and a computer-readable medium, on which is stored a computer program product comprising code instructions for executing a method according to the first aspect for operating a device comprising at least one processing unit and a speaker.

BRIEF DESCRIPTION OF THE DRAWINGS

The above and other objects, features and advantages of this invention will be apparent in the following detailed description of an illustrative embodiment thereof, which is to be read in connection with the accompanying drawings wherein.

DETAILED DESCRIPTION OF CERTAIN ILLUSTRATIVE EMBODIMENTS

Architecture

Figure 1:
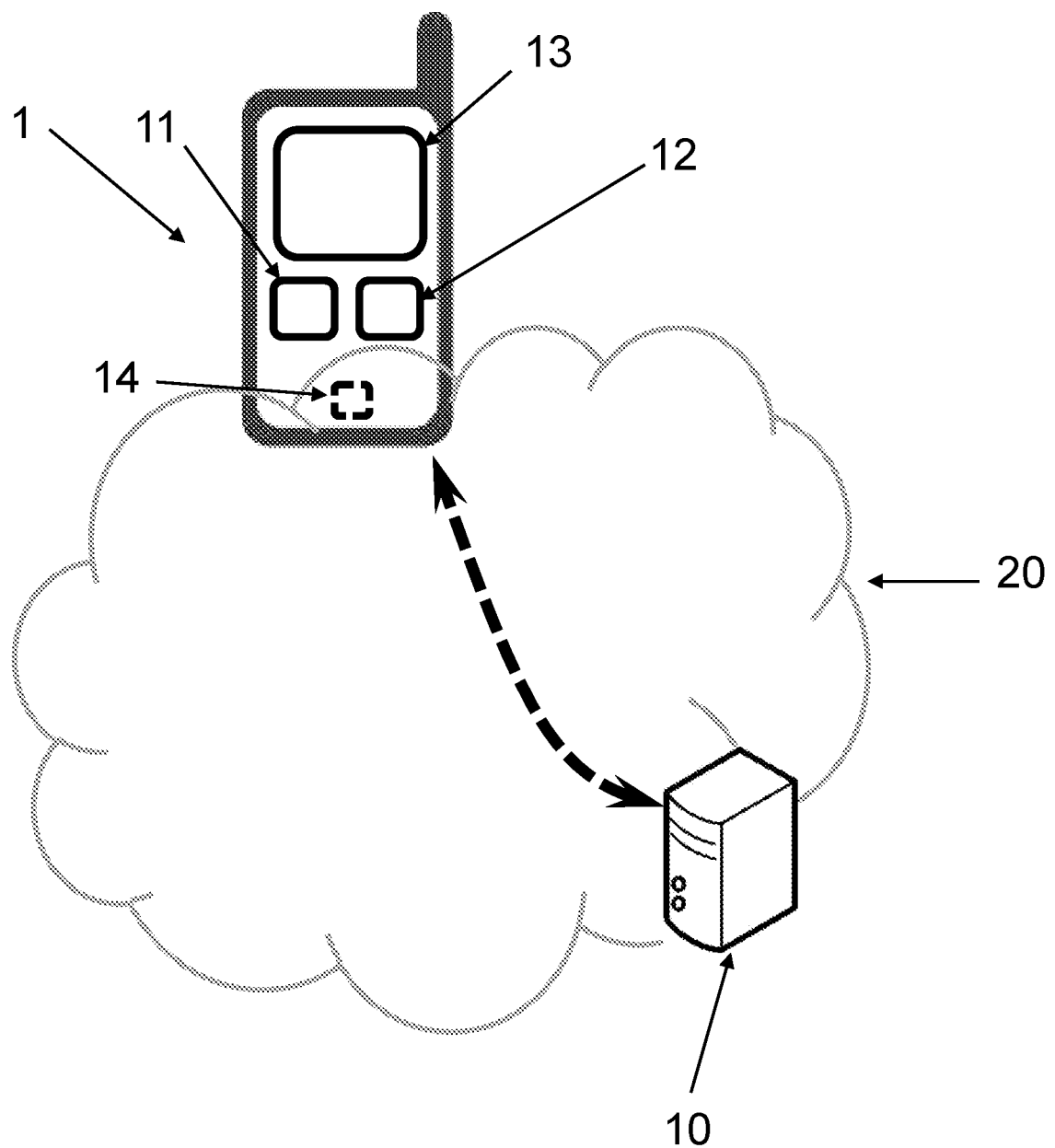
FIG. 1 illustrates an example of architecture in which is performed the method according to the invention.

The present invention relates to a method for operating an electronic device 1 as represented by FIG. 1.

As explained, the electronic device 1 comprises one or more processing unit(s) 11 and a speaker 13 (for instance a built-in speaker, acting as the default audio output unit of the device 1. It is to be noted that the electronic device could comprise a plurality of speakers). In a preferred embodiment, the electronic device 1 further comprises a microphone 14 and possibly a user interface such as a screen, possibly a touch-sensitive screen, for displaying messages.

The electronic device 1 typically further comprises a memory 12 (for example flash memory), in particular for storing applications, which can be of various types. In a known fashion, the processing unit 11 is able to run simultaneously one or more of these applications, in particular as explained:

one application running in "foreground" (i.e. the "top" application); and the possible other applications running in "background" (i.e. "behind the scenes", without user intervention).

In the present method, the processing unit 11 is able to perform a process implying audio output from the speaker 13, such as the playing of a video, a game, etc.

Said "process" is typically the process corresponding to the application running in foreground. In other words, starting a process corresponds to launching a new application, and resuming such process corresponds to unlocking the electronic device 1 while the application runs in foreground or switching the application from background to foreground.

The electronic device 1 may further comprise others units such as a battery, a location unit for providing location data representative of the position of the electronic device 1 (using for example GPS, network triangulation, etc.), a communication unit for connecting (in particular wirelessly) the electronic device 1 to a network 20 (for example WiFi, Bluetooth, and preferably a mobile network, in particular a GSM/UMTS/LTE network, see below), etc.

The electronic device 1 is typically a smartphone, a tablet computer, a laptop, etc. In the following description, the example of a smartphone will be used.

Audio Output from Speaker

The present method is performed by the processing unit 11 of the electronic device 1, and is advantageously implemented by the operating system of this electronic device 1, and in particular a "media controller", i.e. a software module of the operating system dedicated to "push" media data to be played to the right unit, i.e. to the speaker/earphones/a wireless speaker, etc.

For example, the media controller sends audio data toward earphones instead of the speaker 13 when being indicated that earphones are plugged.

To rephrase again, while the operating system generally indistinctly order performing processes implying audio output, the media controller determines whether such audio output should actually be delivered from the speaker 13 or from another unit, such as earphones, etc.

Alternatively, the present method can be implemented by software applications that specifically use audio output (audio/video players, games, etc.).

Figure 2:
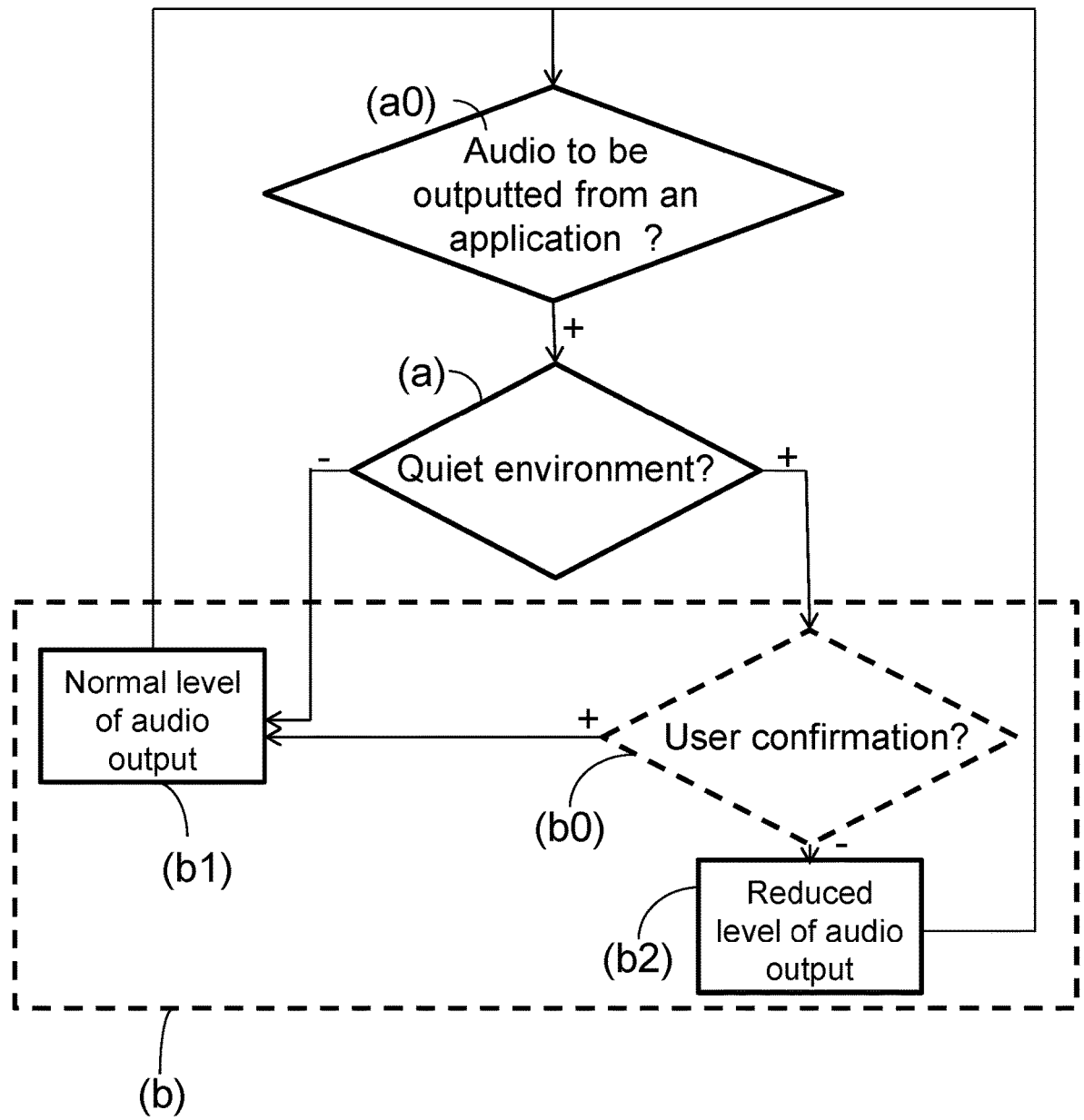
FIG. 2 is a diagram representing steps of a preferred embodiment of a method according to the invention.

As represented by the FIG. 2, the present method comprises a determining step (a) of determining if the electronic device 1 is in a quiet environment, or not.

This determining step (a) is performed after having detected (step A) that a process implying audio output from the speaker 13 is to be performed.

More precisely, detecting that a process implying audio output from the speaker 13 is to be performed (step a0) triggers the determining step (a).

To the contrary, detecting that a process implying no audio output is to be performed does not trigger the determination step (a). To rephrase again, the determining step (a) is performed only when detecting that an process implying some audio output is to be performed.

In a more refined embodiment, detecting that a process implying audio output to another sound outputting unit (such as earphones) than the speaker 13 is to be performed does not trigger the determination step (a). To rephrase again, in such an embodiment, the step (a) is performed only when detecting that a process, which regards an application installed in the electronic device 1 and which implies some audio output from the speaker 13, and not from another sound outputting unit such as earphones, is to be performed.

To this end, the processing unit 11 preferably monitors requests for audio output, from the application to the speaker 13, and triggers the determining step (a) each time a process implying audio output from the speaker 13 is detected based on such requests.

It is to be noted that the media controller inherently performs detecting step (a0) as its very role is to receive and execute various requests for media playing, including requests for audio outputting, in particular from the speaker 13, so that it is very convenient to have the media controller implementing the present method.

In a preferred embodiment, what is detected during detecting step (A) is a process regarding an application installed in the electronic device 1 which implies audio output from the speaker 13, which is to be resumed. Indeed, it may be assumed that the user who starts a new process involving an application which implies audio output from the speaker 13 intends to do so and thus is aware of the risk of loud sound (and thus there is no need to ascertain it). On the other hand, what could be unexpected to the user is the resuming of a process involving an application which implies audio output, leading to embarrassing noises.

In particular there are three situations likely to accidentally happen wherein a process regarding an application which implies audio output from the speaker 13 is resumed:
  the user unlocks the device 1 while the application running in foreground has audio output;
  the user changes the application running in foreground to an application running in background which has audio output;
  the user unplugs/disconnects an external audio output unit (such as earphones, wireless headphones, etc.) while the application running in foreground has audio output, so that the process is immediately resumed with audio output switched (by the media controller) to the speaker 13.

Ambient Noise Analysis

The present method proposes to consider the environment of the electronic device 1 when resuming a process regarding an application, installed in the electronic device 1, which implies audio output from the speaker 13.

By "process regarding an application installed in the electronic device which implies audio output from the speaker", it is meant any process, triggered by a user of the electronic device, which causes an application already running on the electronic device (either in foreground or in background) to provide the speaker 13 with some audio output to be outputted.

Such a process may be a user interacting with the electronic device, wherein this interaction causes an application, already running on the electronic device without providing the speaker 13 with some audio output, to start providing the speaker 13 with some audio output.

Such an interaction is typically an action performed by a user through a user interface of the electronic device 1 (for instance the unlocking of the electronic device while the application is running in the foreground, or the switching of the application from the background to the foreground), but more generically speaking may be any kind of user action performed in relation to the electronic device (for instance when the user unplugs an earphone plugged in the electronic device while listening to the audio output of an application running in foreground).

If the electronic device 1 is in a quiet environment (for instance in a meeting room), a sudden loud audio output is likely to be noticed and embarrassing for the user, and should therefore be avoided.

As explained, in determining step (a), the processing unit 11 determines if the electronic device 1 is in a quiet environment.

It is to be noted that, if it is determined that the electronic device 1 is not in a quiet environment (for instance, in the street), the process regarding an application which implies audio output can be normally performed, or resumed, without any risk to the user.

Determining step (a) is typically a step of "testing" the environment. To this end, when the electronic device 1 comprises a microphone 14, the present method comprises recording ambient noise using the microphone 14, the recorded ambient noise being used to determine if the electronic device 1 is in a quiet environment. By ambient noise, it is understood the sound of the environment. It is to be noted that the media controller has by default control of the microphone 14, so that the embodiment is particularly suitable when the method is implemented by the media controller.

In such an embodiment, determining step (a) could further comprise analyzing the recorded ambient noise so as to determine a noise intensity value. This value could be a physical quantity such as a Decibel value, or a "level" defining a score. The determination step (a) can then rely on this noise intensity value. In a particular embodiment, the environment of the electronic device 1 may be determined as being quiet when this noise intensity value is below a noise threshold, which can be predetermined threshold, for instance. A pre-trained AI model can be used to define the threshold to discriminate between a noisy environment and a quiet environment.

In a first embodiment, the result of determining step (a) is binary: either the noise intensity value is below the threshold and then the environment is considered quiet, or the noise intensity value is above the threshold and then the environment is considered not quiet.

In an alternative embodiment, the noise intensity could be classified among a plurality of levels, for example five levels, corresponding to different ranges of noise level intensity values, so that the "quietness" of the environment could be quantified. For example, the five following noise levels could be used:
  0=silence;
  1=very quiet;
  2=fairly quiet;
  3=fairly noisy;
  4=very noisy.

As a function of the process to be performed or resumed, different thresholds of levels could be used.

For instance, it might be decided that playing or resuming a movie could be embarrassing if the noise level intensity is between 0 and 2.

In any case, it is to be noted that the threshold(s) or the intensity range(s) defining the levels can be learnt by the device 1 itself (see below), or alternatively defined from data remotely provided from a server 10 of the operator of the device 1.

It will be understood that the determination of whether the user is in a quiet environment is not limited to the recording of ambient noise, and other techniques could be used, as for instance counting the number of nearby connectable electronic devices (for instance through Bluetooth or Wi-Fi).

Audio Output Level Reduction

When it has been detected that the electronic device 1 is in a quiet environment, in a further step (b), the process regarding the is performed with a reduced level of audio output from the speaker 13.

To the contrary, if it has not been determined that the electronic device 1 is in a quiet environment (i.e. it has been determined that the electronic device 1 is in a non-quiet environment), said process is preferably performed without a reduced level of audio output from the speaker 13, i.e. with the normal level of audio output.

FIG. 2 represents the two alternative cases:
  (b1) the process is performed with a normal level of audio output from the speaker 13;
  (b2) the process is performed with a reduced level of audio output from the speaker 13.

Here "reduced" is to be understood with respect to said normal level of audio output, which is the "expected" level of audio output as set by the user and which is to be used by default.

The audio output level reduction can be partial (for instance the audio output level is divided by two) or even total (i.e. the speaker 13 is muted: no sound is outputted).

In an advantageous embodiment, the reduced level of audio input is function of the noise intensity value which has been determined during step (a).

For example, considering the five noise levels cited previously, it might be defined that:
- If the noise level intensity value is 0 or 1, the audio output level is reduced to 0 (i.e. the speaker 13 is muted);
- If the noise level is 2, the audio output level is reduced by 50%;
- If the noise level is 3 or 4, the environment is not considered quiet and the audio output level is not reduced at all.

User Confirmation

As represented by FIG. 2, the method may advantageously comprises, if it has been determined in step (a) that the electronic device 1 is in a quiet environment, an optional step (b0) of inviting the user to confirm whether to perform the process with a reduced level of audio output from the speaker 13.

Indeed, despite the environment being quiet, performing the process with a loud audio output from the speaker 13 might actually be voluntary (for example if the user is alone at home), so that a confirmation may be requested.

Step (b0) typically comprises displaying, on the electronic device 1, a prompt to the user such as "you are in a quiet place and the application has audio output, do you confirm to resume it on device speaker?".

Preferably, step (b0) thus comprises requesting the user to choose between three options:
- (b2) performing said process with a reduced level of audio output from the speaker 13 [Mute speaker and resume];
- (b1) performing said process with a normal level of audio output from the speaker 13 [Resume anyways];
- cancelling said process, i.e. not performing it and just going back to the previous state [Cancel].

When it is determined that that the user is not in a quiet environment, there is no need to request confirmation from the user for performing the process with a normal level of audio output from the speaker 13 (it can be done automatically). Indeed, even if the audio output is not wanted by the user, it will not be embarrass the user as the environment is noisy (nobody will notice), so that the number of interactions with the user can be limited.

Device, Computer Product Program, and Computer-Readable Medium

The present invention concerns an electronic device 1 comprising at least one processing unit 11 and a speaker 13, wherein the processing unit 11 is adapted for carrying out the method for operating as previously described.

This electronic device 1 may also comprise a memory 12, a microphone 14. The device 1 is typically a smartphone.

The aforementioned processing unit 11 is in particular configured to implement the steps of:
when detecting that a process regarding an application installed in the electronic device which implies audio output from the speaker 13 is to be performed, determining that the electronic device is in a quiet environment (in particular through recording ambient noise using the microphone 14, analyzing the recorded ambient noise so as to determine a noise intensity value, and comparing it to one or more thresholds);
when determining that the electronic device is in a quiet environment, performing said process with a reduced level of audio output from the speaker 13 (or if determining that the electronic device is not in a quiet environment, performing said process with a normal level of audio output from the speaker 13), possibly after asking the user for confirmation.

As already explained, the present method is preferably implemented by a media controller of an operating system of the electronic device 1.

The invention further proposes a computer program product, comprising code instructions for executing (in particular with a processing unit 11 of the device 1) the previously described method, as well as a computer-readable medium (in particular a memory 12 of the device 1), on which is stored a computer program product comprising code instructions for executing said method. In particular, this computer program product may correspond to the operating system, and especially the media controller.

The invention claimed is:

1. A method of operating an electronic device comprising a processing unit and a speaker, the method being performed by the processing unit and comprising
detecting that a process regarding an application installed in the electronic device which implies audio output from the speaker is to be performed,
determining (a) that the electronic device is in a quiet environment; and
when the electronic device is determined as being in a quiet environment, performing (b) the process with a reduced level of audio output from the speaker,
wherein a situation wherein the process regarding the application installed in the electronic device which implies audio output from the speaker is to be performed corresponds to:
a switching of the application from running in a background to running in the foreground while the application provides the audio output.

2. The method of claim 1, wherein the electronic device further comprises a microphone, the method further comprising recording ambient noise using the microphone, the determining (a) being performed based on the recorded ambient noise.

3. The method of claim 2, wherein the determining (a) further comprises analyzing the recorded ambient noise so as to determine a noise intensity value, the determining (a) being performed based on the determined noise intensity value.

4. The method of claim 3, wherein the electronic device is determined as being in a quiet environment when the noise intensity value is below a noise threshold.

5. The method of claim 3, wherein the reduced level of audio output is a function of the determined noise intensity value.

6. The method of claim 1, wherein the speaker is muted in the performing (b).

7. The method of claim 1, wherein the method is implemented by a media controller of an operating system of the electronic device.

8. The method of claim 1, further comprising, when the electronic device is determined as being in the quiet environment, inviting the user to confirm whether to perform the process with the reduced level of audio output from the speaker.

9. The method of claim 8, wherein the inviting comprises requesting the user to choose one of the following acts:
performing the process with the reduced level of audio output from the speaker;
performing the process with a normal level of audio output from the speaker;
cancelling the process.

10. A computing environment comprising a processor and a memory, the memory storing code instructions executed by the processor to implement the method of claim 1 for operating the electronic device comprising at least the processor and the speaker.

11. A non-transitory computer-readable storage medium, on which are stored code instructions executed by a processor to implement the method of claim 1 for operating the electronic device comprising at least the processor and the speaker.

12. The method of claim 1, wherein detecting that the process regarding the application installed in the electronic device which implies audio output from the speaker is to be performed is performed during running of the application providing audio output.

13. An electronic device comprising at least one processing unit and a speaker, the processing unit being configured to implement:
detecting that a process regarding an application installed in the electronic device which implies audio output from the speaker is to be performed,
determining that the electronic device is in a quiet environment; and
when the electronic device is determined as being in a quiet environment, performing the process with a reduced level of audio output from the speaker,
wherein a situation wherein the process regarding the application installed in the electronic device which implies audio output from the speaker is to be performed corresponds to:
a switching of the application from running in a background to running in the foreground while the application provides the audio output.

14. The electronic device of claim 13, wherein the electronic device further comprises a microphone which is configured to record ambient noise using the microphone, wherein the act of determining that the electronic device is in a quiet environment is performed based on the recorded ambient noise.

15. The electronic device of claim 14, wherein the processing unit is further configured to analyze the recorded ambient noise so as to determine a noise intensity value, the act of determining that the electronic device is in a quiet environment being performed based on the determined noise intensity value.

16. The electronic device of claim 15, wherein the reduced level of audio output is a function of the determined noise intensity value.

17. The electronic device of claim 13, wherein the processing unit is further configured, when the electronic device is determined as being in the quiet environment, to invite the user to confirm whether to perform the process with the reduced level of audio output from the speaker.

* * * * *